US008264276B2

(12) United States Patent
Huang et al.

(10) Patent No.: US 8,264,276 B2
(45) Date of Patent: Sep. 11, 2012

(54) LOW-NOISE AMPLIFIER

(75) Inventors: Daquan Huang, Allen, TX (US); Richard Gu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/966,761

(22) Filed: Dec. 13, 2010

(65) Prior Publication Data

US 2012/0146724 A1    Jun. 14, 2012

(51) Int. Cl.
*H03F 3/45* (2006.01)
(52) U.S. Cl. ........................................ 330/253; 330/165
(58) Field of Classification Search .................. 330/165, 330/185, 195, 253
See application file for complete search history.

(56) References Cited

U.S. PATENT DOCUMENTS

| | | | |
|---|---|---|---|
| 7,509,111 B2 * | 3/2009 | Langenberg et al. | 455/326 |
| 8,022,776 B2 * | 9/2011 | Chang et al. | 330/165 |
| 2005/0122173 A1 | 6/2005 | Floyd | |
| 2007/0273445 A1 | 11/2007 | Sarkar et al. | |
| 2011/0121903 A1 * | 5/2011 | Song et al. | 330/310 |

OTHER PUBLICATIONS

"60-GHz PA and LNA in 90-nm RF-CMOS," IEEE Radio Frequency Integrated Circuits (RFIC) Symposium, Jun. 11-13, 2006, pp. 4 (Terry Yao, Michael Gordon, Kenneth Yau, M.T. Yang, and Sorin P. Voinigescu).
"A 60GHz Variable-gain LNA in 65nm CMOS," IEEE Asian Solid-State Circuits Conference, Nov. 3-5, 2008, pp. 117-120 (Arun Natarajan, Sean Nicolson, Ming-Da Tsai and Brian Floyd).
"A Fully Integrated 60 GHz LNA in SiGe:C BiCMOS Technology," Proceedings of the Bipolar/BiCMOS Circuits and Technology Meeting, Oct. 9-11, 2005, pp. 14-17 (Y. Sun, J. Borngraber, F. Herzel, W. Winkler).
"Algorithmic Design of CMOS LNAs and PAs for 60-GHz," IEEE Journal of Solid-State Circuits, vol. 42, No. 5, May 2007, pp. 1044-1057 (Terry Yao, Michael Q. Gordon, Keith K. W. Tang, Kenneth H. K. Yau, Ming-Ta Yang, Peter Schvan, and Sorin P. Voinigescu).
"A 60-GHz CMOS Receiver Front-End," IEEE Journal of Solid-State Circuits, vol. 41, No. 1, Jan. 2006, pp. 17-22 (Behzad Razavi).

\* cited by examiner

*Primary Examiner* — Khanh V Nguyen
(74) *Attorney, Agent, or Firm* — John J. Patti; Wade J. Brady, III; Frederick J. Telecky, Jr.

(57) ABSTRACT

Traditionally, low-noise amplifiers or LNAs have been used in high frequency applications, but for very high frequency ranges (i.e., 60 GHz), building an LNA to meet performance needs has been difficult. Here, however, an LNA has been provided that operates well around 60 GHz. In particularly, this LNA is generally unconditionally stable, has a generally low noise factor or NF, and has a generally high gain around 60 GHz.

10 Claims, 2 Drawing Sheets

LOW-NOISE AMPLIFIER

TECHNICAL FIELD

The invention relates generally to a low-noise amplifier (LNA) and, more particularly, to an LNA that operates near 60 GHz.

BACKGROUND

LNAs are commonly used in high frequency applications, but for very high frequency ranges (i.e., 60 GHz), building an LNA to meet performance needs can be difficult. At these very high frequency ranges, parasitics (for example) can impede performance, which can limit the gain and create other issues. Thus, there is a need for an LNA that operates in very high frequency ranges (i.e., 60 GHz). Some conventional circuits are: U.S. Patent Pre-Grant Publ. No. 2005/0122173; U.S. Patent Pre-Grant Publ. No. 2007/0273445; Yao et al., 60-GHz PA and LNA in 90-nm RF-CMOS" 2006 *IEEE Radio Frequency Integrated Circuits (RFIC) Symposium*, Jun. 11-13, 2006, pp. 4; Natarajan et al., "A 60 GHz Variable-gain LNA in 65 nm CMOS," *IEEE Asian Solid-state Circuits Conference*, Nov. 3-5, 2008, pp. 117-120; Sun et al., "A Fully Integrated 60 GHz LNA in SiGe:C BiCMOS Technology," 2005 *Proceedings of the Bipolar/BiCMOS Circuits and Technology Meeting*, Oct. 9-11, 2005, pp. 14-17; Yao et al., "Algorithmic Design of CMOS LNAs and Pas for 60-GHz Radio," *IEEE J. of Solid-State Circuits*, Vol. 42, No. 5, May 2007, pp. 1044-1057; and Behzad Razavi, "A 60-GHz CMOS Receiver Front-End," *J. of Solid-State Circuits*, Vol. 41, No. 1, January 2006, pp. 17-22.

SUMMARY

A preferred embodiment of the present invention, accordingly, provides an apparatus. The apparatus comprises a first voltage rail; a second voltage rail; an input section that is coupled to the first and second voltage rails and that receives a differential input signal; and an output section having: a first transistor having a first passive electrode, a second passive electrode, and a control electrode, wherein the first passive electrode of the first transistor is coupled to the second voltage rail, and wherein the control electrode of the first transistor is coupled to the input section; a second transistor having a first passive electrode, a second passive electrode, and a control electrode, wherein the first passive electrode of the second transistor is coupled to the second voltage rail, and wherein the control electrode of the second transistor is coupled to the input section; a first inductor that is coupled to the second passive electrode of the first transistor; a second inductor that is coupled to the second passive electrode of the second transistor; and a common control electrode amplifier that is coupled to the first and second inductors, wherein the common control electrode amplifier includes a peaking inductor.

In accordance with a preferred embodiment of the present invention, the first and second transistors further comprises first and second MOS transistors, wherein the first MOS transistor is coupled to the second voltage rail at its source, and wherein the second MOS transistor is coupled to the second rail at its drain, and wherein the common control electrode amplifier further comprises a common-gate amplifier.

In accordance with a preferred embodiment of the present invention, the peaking inductor further comprises a first peaking inductor that is coupled to the first voltage rail, and wherein the common-gate amplifier further comprises: a second peaking inductor that is coupled to the first voltage rail; a third MOS transistor that is coupled to the first peaking inductor at its drain, the first inductor at its source, and the second voltage rail at its gate; and a fourth MOS transistor that is coupled to the second peaking inductor at its drain, the second inductor at its source, and the second voltage rail at its gate.

In accordance with a preferred embodiment of the present invention, the input section further comprises: a differential input pair of transistor that receives the differential input signal; and a transformer that is coupled to the differential input pair of transistors and the control electrodes of the first and second transistors.

In accordance with a preferred embodiment of the present invention, the transformer further comprises: a primary winding having a first center tap, wherein the primary winding is coupled to the differential input pair of transistors, and wherein the first center tap is coupled to the first voltage rail; and a secondary winding having a second center tap, wherein the secondary winding is coupled to the control electrodes of the first and second transistors, and wherein the second center tap is coupled to the first voltage rail.

In accordance with a preferred embodiment of the present invention, an apparatus is provided. The apparatus comprises a first voltage rail; a second voltage rail; a differential input pair of transistor that receives a differential input signal; a transformer that is coupled to the differential input pair of transistors; a first transistor having a first passive electrode, a second passive electrode, and a control electrode, wherein the first passive electrode of the first transistor is coupled to the second voltage rail, and wherein the control electrode of the first transistor is coupled to the transformer; a second transistor having a first passive electrode, a second passive electrode, and a control electrode, wherein the first passive electrode of the second transistor is coupled to the second voltage rail, and wherein the control electrode of the second transistor is coupled to the transformer; a first inductor that is coupled to the second passive electrode of the first transistor; a second inductor that is coupled to the second passive electrode of the second transistor; and a common control electrode amplifier that is coupled to the first and second inductors, wherein the common control electrode amplifier includes a peaking inductor.

In accordance with a preferred embodiment of the present invention, the first and second transistors further comprises first and second MOS transistors, wherein the first NMOS transistor is coupled to the second voltage rail at its source, and wherein the second NMOS transistor is coupled to the second rail at its drain, and wherein the common control electrode amplifier further comprises a common-gate amplifier.

In accordance with a preferred embodiment of the present invention, the peaking inductor further comprises a first peaking inductor that is coupled to the first voltage rail, and wherein the common-gate amplifier further comprises: a second peaking inductor that is coupled to the first voltage rail; a third NMOS transistor that is coupled to the first peaking inductor at its drain, the first inductor at its source, and the second voltage rail at its gate; and a fourth NMOS transistor that is coupled to the second peaking inductor at its drain, the second inductor at its source, and the second voltage rail at its gate.

In accordance with a preferred embodiment of the present invention, the transformer further comprises: a primary winding having a first center tap, wherein the primary winding is coupled to the differential input pair of transistors, and wherein the first center tap is coupled to the second voltage rail; and a secondary winding having a second center tap, wherein the secondary winding is coupled to the gates of the first and second NMOS transistors, and wherein the second center tap is coupled to the second voltage rail.

In accordance with a preferred embodiment of the present invention, the differential input pair of transistors further comprise: a fifth NMOS transistor that is coupled to the primary winding at its drain and the second voltage rail at its source; and a sixth NMOS transistor that is coupled to the primary winding at its drain and the second voltage rail at its source.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
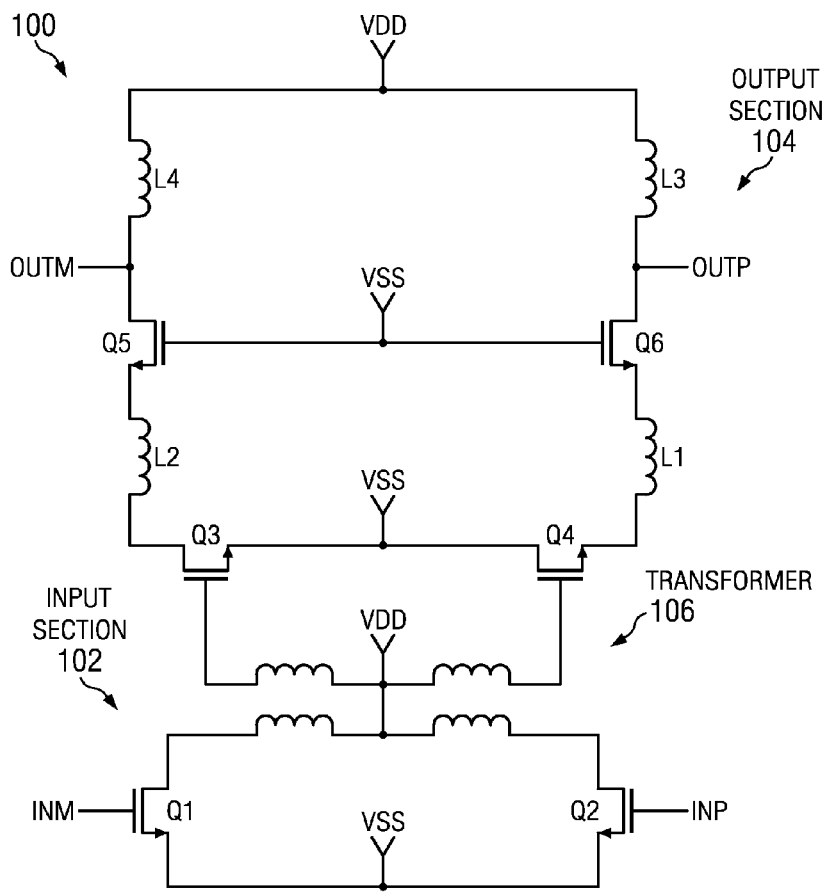
FIG. 1 is a circuit diagram of an example of an LNA in accordance with a preferred embodiment of the present invention.

Refer now to the drawings wherein depicted elements are, for the sake of clarity, not necessarily shown to scale and wherein like or similar elements are designated by the same reference numeral through the several views.

Turning to FIG. 1, a LNA 100 in accordance with a preferred embodiment of the present invention can be seen. As shown, this LNA 100 generally comprises an input section 102 and an output section 104. The input section 102 generally comprises a differential input pair of transistors Q1 and Q2 (which can be NMOS transistors and which are coupled to the voltage rail VSS) and a transformer 106. The output section 104 generally comprises input transistors Q3 and Q4 (which can be NMOS transistors), inductors or load inductors L1 and L2 (which can each, for example, be about 250 pH), and a common control electrode amplifier (i.e., common-gate amplifier as shown in this example or a common-base amplifier). The common-gate amplifier (as shown) generally includes transistors Q5 and Q6 (which can be NMOS transistors) and peaking inductors L3 and L4 (which can each, for example, be about 250 pH).

In operation, a differential input signal INP and INM is provided to the control electrodes (or gates as shown) of transistors Q1 and Q2 so as to generate differential output signal OUTP and OUTM from the output section 104. These transistors Q1 and Q2 operate as a transconductance circuit, passing an output signal to the primary winding of transformer 106, while the secondary winding is coupled to the control electrodes (i.e., gates) of transistors Q3 and Q4. Both the primary and secondary windings of transformer 106 have center taps that are coupled to the voltage rail VDD, and this transformer 106 can then provide a large amount of headroom, allowing for two to three times extra gain. Similar to transistors Q1 and Q2, transistors Q3 and Q4 operate as transconductance circuit for the output section 104. The loading inductors L1 and L2 (which are generally coupled to transistors Q3 and Q4) can then operate as band pass filter for the common-gate (as shown) amplifier (i.e., transistors Q5 and Q6). Additionally, peaking inductors L3 and L4 can oscillate parasitic capacitances to increase gain by about 2.5 dB at about 60 Ghz, for example.

Figure 2:
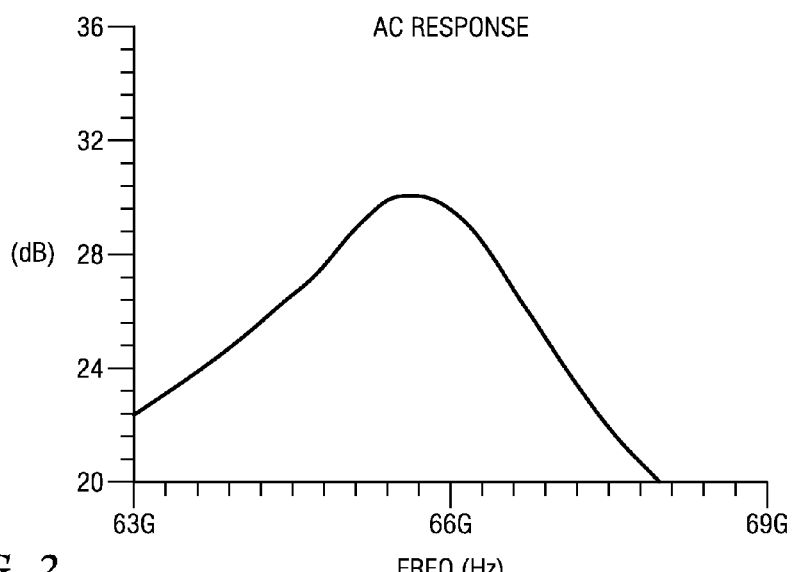
FIGS. 2 through 4 are diagrams depicting the performance characteristics of the LNA of FIG. 1.
Figure 3:
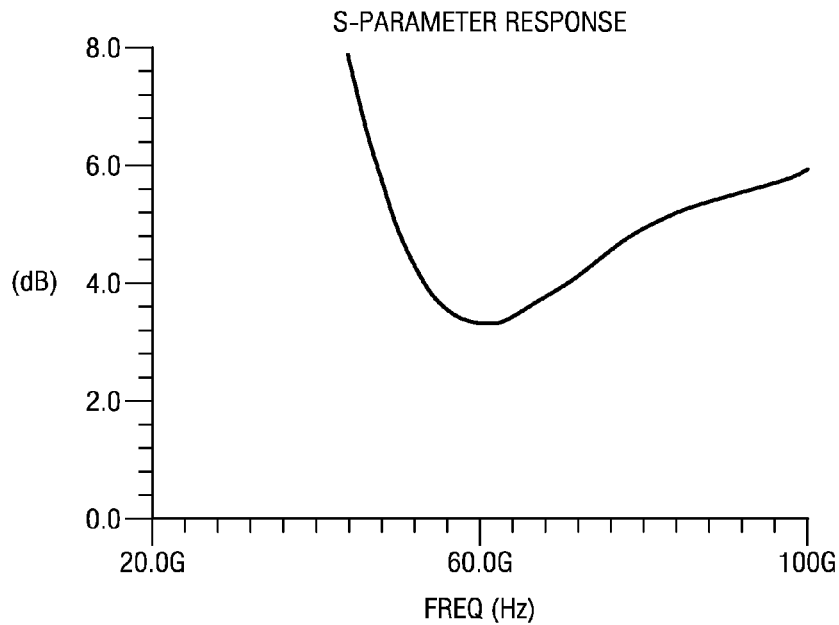
Figure 4:
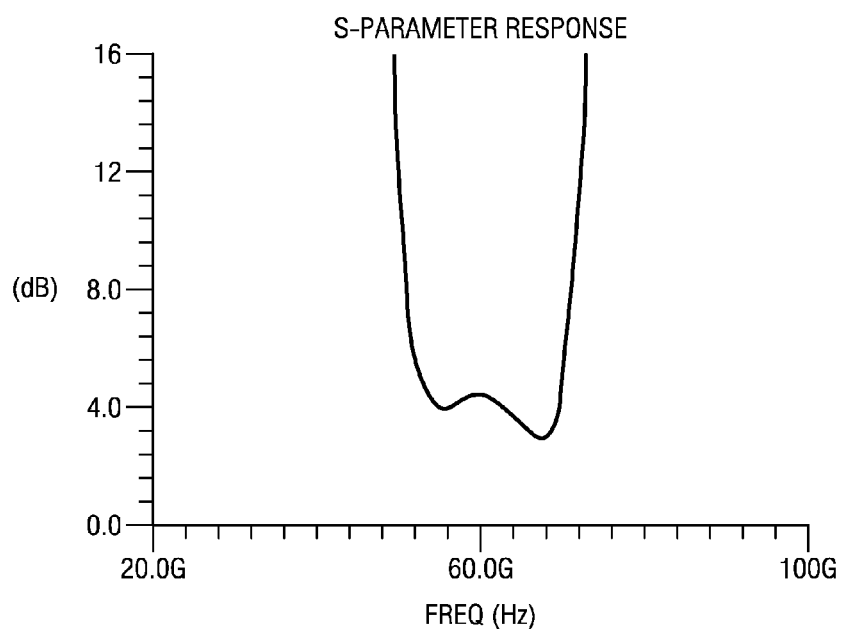

Now, turning to FIGS. 2-4, the performance of amplifier 100 can be seen. In FIG. 4, the AC response or output voltage as a function of frequency of the LNA 100, which can be about 30.3576 dB of gain around at 65.6505 GHz. FIGS. 5 and 6, on the other hand, shows S-parameter responses of LNA; namely, the Noise Figure (NF) and Stability Factor (Kf) can be seen in FIGS. 5 and 6, respectively. As shown, the NF of LNA 100 can be about 3.3670 dB at about 60.2 GHz, and the Kf can be about 2.97954 dB at about 66.9 GHz. Thus, LNA 100 is generally unconditionally stable, has a generally low NF, and has a generally high gain around 60 GHz.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
  a first voltage rail;
  a second voltage rail;
  an input section that is coupled to the first and second voltage rails and that receives a differential input signal; and
  an output section having:
    a first transistor having a first passive electrode, a second passive electrode, and a control electrode, wherein the first passive electrode of the first transistor is coupled to the second voltage rail, and wherein the control electrode of the first transistor is coupled to the input section;
    a second transistor having a first passive electrode, a second passive electrode, and a control electrode, wherein the first passive electrode of the second transistor is coupled to the second voltage rail, and wherein the control electrode of the second transistor is coupled to the input section;
    a first inductor that is coupled to the second passive electrode of the first transistor;
    a second inductor that is coupled to the second passive electrode of the second transistor; and
    a common control electrode amplifier that is coupled to the first and second inductors, wherein the common control electrode amplifier includes a peaking inductor.

2. The apparatus of claim 1, wherein the first and second transistors comprises first and second MOS transistors, wherein the first MOS transistor is coupled to the second voltage rail at its source, and wherein the second MOS transistor is coupled to the second voltage rail at its drain, and wherein the common control electrode amplifier comprises a common-gate amplifier.

3. The apparatus of claim 2, wherein the peaking inductor further comprises a first peaking inductor that is coupled to the first voltage rail, and wherein the common-gate amplifier further comprises:
   a second peaking inductor that is coupled to the first voltage rail;
   a third MOS transistor that is coupled to the first peaking inductor at its drain, the first inductor at its source, and the second voltage rail at its gate; and
   a fourth MOS transistor that is coupled to the second peaking inductor at its drain, the second inductor at its source, and the second voltage rail at its gate.

4. The apparatus of claim 1, wherein the input section further comprises:
   a differential input pair of transistor that receives the differential input signal; and
   a transformer that is coupled to the differential input pair of transistors and the control electrodes of the first and second transistors.

5. The apparatus of claim 4, wherein the transformer further comprises:
   a primary winding having a first center tap, wherein the primary winding is coupled to the differential input pair of transistors, and wherein the first center tap is coupled to the first voltage rail; and
   a secondary winding having a second center tap, wherein the secondary winding is coupled to the control electrodes of the first and second transistors, and wherein the second center tap is coupled to the first voltage rail.

6. An apparatus comprising:
   a first voltage rail;
   a second voltage rail;
   a differential input pair of transistor that receives a differential input signal;
   a transformer that is coupled to the differential input pair of transistors;
   a first transistor having a first passive electrode, a second passive electrode, and a control electrode, wherein the first passive electrode of the first transistor is coupled to the second voltage rail, and wherein the control electrode of the first transistor is coupled to the transformer;
   a second transistor having a first passive electrode, a second passive electrode, and a control electrode, wherein the first passive electrode of the second transistor is coupled to the second voltage rail, and wherein the control electrode of the second transistor is coupled to the transformer;
   a first inductor that is coupled to the second passive electrode of the first transistor;
   a second inductor that is coupled to the second passive electrode of the second transistor; and
   a common control electrode amplifier that is coupled to the first and second inductors, wherein the common control electrode amplifier includes a peaking inductor.

7. The apparatus of claim 6, wherein the first and second transistors comprises first and second MOS transistors, wherein the first NMOS transistor is coupled to the second voltage rail at its source, and wherein the second NMOS transistor is coupled to the second voltage rail at its drain, and wherein the common control electrode amplifier comprises a common-gate amplifier.

8. The apparatus of claim 7, wherein the peaking inductor further comprises a first peaking inductor that is coupled to the first voltage rail, and wherein the common-gate amplifier further comprises:
   a second peaking inductor that is coupled to the first voltage rail;
   a third NMOS transistor that is coupled to the first peaking inductor at its drain, the first inductor at its source, and the second voltage rail at its gate; and
   a fourth NMOS transistor that is coupled to the second peaking inductor at its drain, the second inductor at its source, and the second voltage rail at its gate.

9. The apparatus of claim 8, wherein the transformer further comprises:
   a primary winding having a first center tap, wherein the primary winding is coupled to the differential input pair of transistors, and wherein the first center tap is coupled to the second voltage rail; and
   a secondary winding having a second center tap, wherein the secondary winding is coupled to the gates of the first and second NMOS transistors, and wherein the second center tap is coupled to the second voltage rail.

10. The apparatus of claim 9, wherein the differential input pair of transistors further comprise:
   a fifth NMOS transistor that is coupled to the primary winding at its drain and the second voltage rail at its source; and
   a sixth NMOS transistor that is coupled to the primary winding at its drain and the second voltage rail at its source.

* * * * *